United States Patent
Kim et al.

(10) Patent No.: US 9,351,403 B2
(45) Date of Patent: May 24, 2016

(54) PORTABLE TERMINAL

(71) Applicant: SAMSUNG ELECTRO-MECHANICS CO., LTD., Suwon (KR)

(72) Inventors: Gi Suk Kim, Suwon (KR); Yang Je Lee, Suwon (KR); Hee Ju Park, Suwon (KR); Jong Hyung Kim, Suwon (KR); Chang Hyun Kim, Suwon (KR); Kyeong Seon Chae, Suwon (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 211 days.

(21) Appl. No.: 13/921,685

(22) Filed: Jun. 19, 2013

(65) Prior Publication Data

US 2013/0343013 A1    Dec. 26, 2013

(30) Foreign Application Priority Data

Jun. 20, 2012  (KR) .................. 10-2012-0066303
Oct. 31, 2012  (KR) .................. 10-2012-0122517

(51) Int. Cl.
*H05K 1/14* (2006.01)
*H05K 5/00* (2006.01)
*H05K 1/02* (2006.01)
*H05K 3/46* (2006.01)

(52) U.S. Cl.
CPC ............... *H05K 1/14* (2013.01); *H05K 1/0277* (2013.01); *H05K 1/0298* (2013.01); *H05K 1/148* (2013.01); *H05K 3/4691* (2013.01); *H05K 5/0026* (2013.01); *H05K 1/0278* (2013.01)

(58) Field of Classification Search
CPC .......... H05K 1/14; H05K 1/147; H05K 1/148
See application file for complete search history.

(56) References Cited

U.S. PATENT DOCUMENTS

| | | | | |
|---|---|---|---|---|
| 6,031,730 | A * | 2/2000 | Kroske | H01R 9/096 361/784 |
| 6,469,255 | B2 * | 10/2002 | Watanabe et al. | 174/254 |
| 6,531,662 | B1 * | 3/2003 | Nakamura | H01M 10/4257 174/254 |
| 6,697,259 | B1 * | 2/2004 | Nakamura | 361/752 |
| 8,039,754 | B2 * | 10/2011 | Fink | B60R 16/0215 174/251 |
| 8,259,455 | B2 * | 9/2012 | Dubois | H05K 1/0275 174/254 |
| 2002/0006503 | A1 * | 1/2002 | Watanabe et al. | 428/209 |

(Continued)

FOREIGN PATENT DOCUMENTS

CN    101853980 A    10/2010
JP    2003-216278    7/2003

(Continued)

OTHER PUBLICATIONS

Office action dated Jun. 3, 2014 from corresponding Japanese Patent Application No. 2013-128910 and its English summary.

(Continued)

*Primary Examiner* — Hoa C Nguyen
*Assistant Examiner* — Xanthia C Cunningham
(74) *Attorney, Agent, or Firm* — NSIP Law

(57) ABSTRACT

Disclosed herein is a portable terminal, including: a case; a first substrate disposed at one side of the case; a second substrate spaced from the first substrate to form a battery installing space; and a connection substrate electrically connecting between the first substrate and the second substrate and disposed in parallel with a side of the case.

13 Claims, 7 Drawing Sheets

(56) References Cited

U.S. PATENT DOCUMENTS

| | | | | |
|---|---|---|---|---|
| 2002/0081894 A1* | 6/2002 | Fuerst | ............... | H01R 12/613 439/492 |
| 2005/0230852 A1* | 10/2005 | Lee et al. | ............... | 257/787 |
| 2005/0232095 A1* | 10/2005 | Okamoto | ............... | G11B 7/12 369/44.11 |
| 2008/0014787 A1* | 1/2008 | Kim | ............... | G06F 1/1626 439/517 |
| 2011/0147048 A1* | 6/2011 | Yamamoto et al. | ............... | 174/126.1 |
| 2011/0169698 A1 | 7/2011 | Niemi | | |

FOREIGN PATENT DOCUMENTS

| | | |
|---|---|---|
| JP | 2007-028094 | 2/2007 |
| KR | 10-0642447 | 10/2006 |
| KR | 10-0744363 | 7/2007 |
| KR | 10-2011-0044529 A | 4/2011 |
| KR | 10-2012-0009833 | 2/2012 |
| WO | 00/65888 | 11/2000 |

OTHER PUBLICATIONS

Office action dated Jan. 17, 2014 from corresponding Korean Patent Application No. 10-2012-0122517 and its English summary provided by the clients.

German Office Action issued Oct. 29, 2015 in counterpart German Patent Application No. 10 2013 106 305.5 (pp. 1-6 in English; pp. 7-18 in German).

Chinese Office Action issued Jun. 3, 2015 in counterpart Chinese Application No. CN 201310247095.2 (12 pages, in Chinese, with English language translation).

* cited by examiner

PORTABLE TERMINAL

CROSS REFERENCE TO RELATED APPLICATION

This application claims the benefits of Korean Patent Application No. 10-2012-0066303, filed on Jun. 20, 2012, entitled "Cradle for Portable Terminal", and Korean Patent Application No. 10-2012-0122517, filed on Oct. 31, 2012, entitled "Mobile Apparatus Having Vertical and Horizontal Substrate Structures", which are hereby incorporated by reference in its entirety into this application.

BACKGROUND OF THE INVENTION

1. Technical Field

The present invention relates to a portable terminal capable of securing a battery installing space.

2. Description of the Related Art

Generally, a portable terminal such as a smart phone may be provided with various contents such as a game, a moving picture, or the like. In order to use the contents such as the game, the moving picture, or the like, capacity of a battery may be increased.

In addition, in recent trend of the portable terminal, an increase in a battery consumption amount and slimness of a set are becoming an issue according to a continuous increase of processing speed due to an integration of a computer function and an increase of a display size. Therefore, expanding battery capacity and securing battery space are main subjects of all of set manufacturer.

The battery capacity of the above-mentioned portable terminal may be proportional to a size of the battery. A structure of the portable terminal may be variously changed in order to secure a battery installing space.

Referring to a substrate structure of the portable terminal according to the prior art, a main substrate in charge of a digital part and a sub-substrate in charge of an RF part are disposed on a horizontal plane of a case and the battery is disposed on the same plane as that of these substrates, such that a dead space is generated and there is a limitation in the battery capacity and part arrangement structure.

Korean Patent Publication No. 10-06242447 (published on Nov. 2, 2006) which is Patent Document described in the following prior art documents relates to a mobile telecommunication terminal and discloses a structure of a battery pack mounted on the mobile telecommunication terminal, and Korea Patent Laid-Open Publication No. 2012-0009833 (laid-open published on Feb. 2, 2012) discloses a mobile terminal.

PRIOR ART DOCUMENT

Patent Document (Patent Document 1) Korean Patent Publication No. 10-0642447 (published on Nov. 2, 2006)
(Patent Document 2) Korean Patent Laid-Open Publication No. 2012-0009833 (laid-Open published on Feb. 2, 2012)

SUMMARY OF THE INVENTION

The present invention has been made in an effort to provide a portable terminal capable of removing a dead space and securing a battery space to maximize space utilization by changing a substrate structure using a horizontal-vertical substrate structure.

According to a preferred embodiment of the present invention, there is provided a portable terminal, including: a case; a first substrate disposed at one side of the case; a second substrate spaced from the first substrate to form a battery installing space; and a connection substrate electrically connecting between the first substrate and the second substrate and disposed in parallel with a side of the case.

The portable terminal may further include: a first flexible substrate electrically connecting between the first substrate and one side of the connection substrate; and a second flexible substrate electrically connecting the second substrate and the other side of the connection substrate.

The connection substrate may be disposed perpendicularly to the first substrate and the second substrate.

The first substrate and the second substrate may be a rigid substrate.

The connection substrate may be a rigid substrate.

According to another preferred embodiment of the present invention, there is provided a portable terminal, including: a case including a horizontal plane having a predetermined length and width and a vertical plane having a predetermined height; a flexible-rigid substrate including a first rigid substrate part formed horizontally in a horizontal plane of the case, a second rigid substrate part formed almost perpendicularly to the horizontal plane in the vertical plane of the case, and a flexible substrate part formed integrally so as to bendably and electrically connect between the first rigid substrate part and the second rigid substrate part; and a battery electrically connected to the flexible-rigid substrate to supply power.

The flexible substrate part may have a first area in the horizontal plane of the case, may have a second area in the vertical plane, and may be formed so that a third area connected integrally to a part of the first area and a part of the second area is bendable, the first rigid substrate part may form a first rigid region in the first area of the flexible substrate part so as to pattern a first circuit pattern in charge of a digital processing part or mount a first circuit element on the first rigid region, and the second rigid substrate part may form a second rigid region in the second area of the flexible substrate so as to pattern a second circuit pattern in charge of a radio frequency (RF) processing part or mount a second circuit element on the second rigid region.

The battery may be disposed on the same plane as a horizontal plane of the flexible-rigid substrate and may have a size expanded by a space secured in the horizontal plane due to the second rigid substrate part formed perpendicularly to the horizontal plane.

The flexible substrate part may include: a polyimide layer including the first, second, and third areas; first conductive layers formed on both surfaces of the polyimide layer; and coverlay layers formed on upper surfaces of the first conductive layers.

The first conductive layer may be patterned with a wiring pattern electrically connecting the first rigid substrate part and the second rigid substrate part.

The first rigid substrate part may include: prepregs formed on both surfaces of the first rigid region of the flexible substrate part; second conductive layers formed on upper surfaces of the prepregs; and photosensitive solder resist (PSR) ink formed on upper surfaces of the second conductive layers.

The second conductive layer may be patterned with the first circuit pattern by exposure and etching or may be mounted with the first circuit element.

The second rigid substrate part may include: prepregs formed on both surfaces of the second rigid region of the flexible substrate part; third conductive layers formed on upper surfaces of the prepregs; and photosensitive solder resist (PSR) ink formed on upper surfaces of the third conductive layers.

The third conductive layer may be patterned with the second circuit pattern by exposure and etching or may be mounted with the second circuit element.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
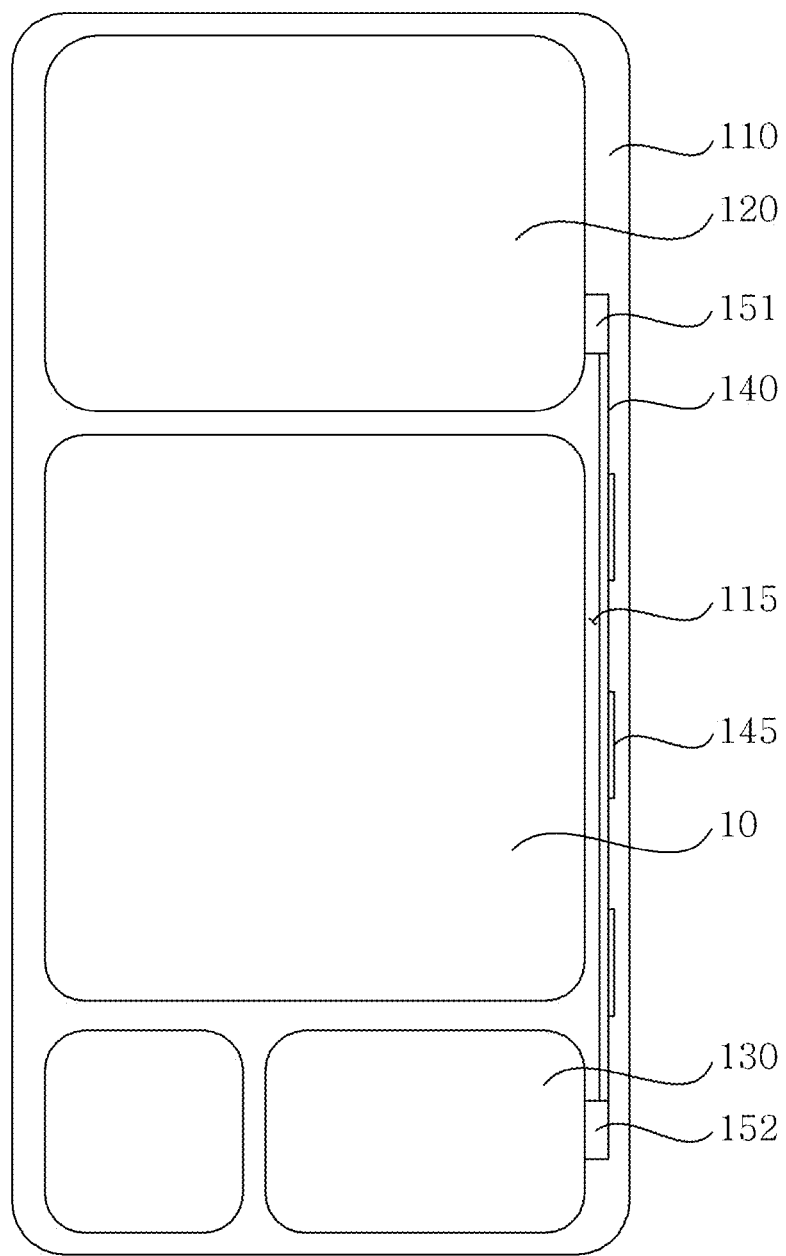
FIG. 1 is a view showing a portable terminal according to a first preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

Figure 2:
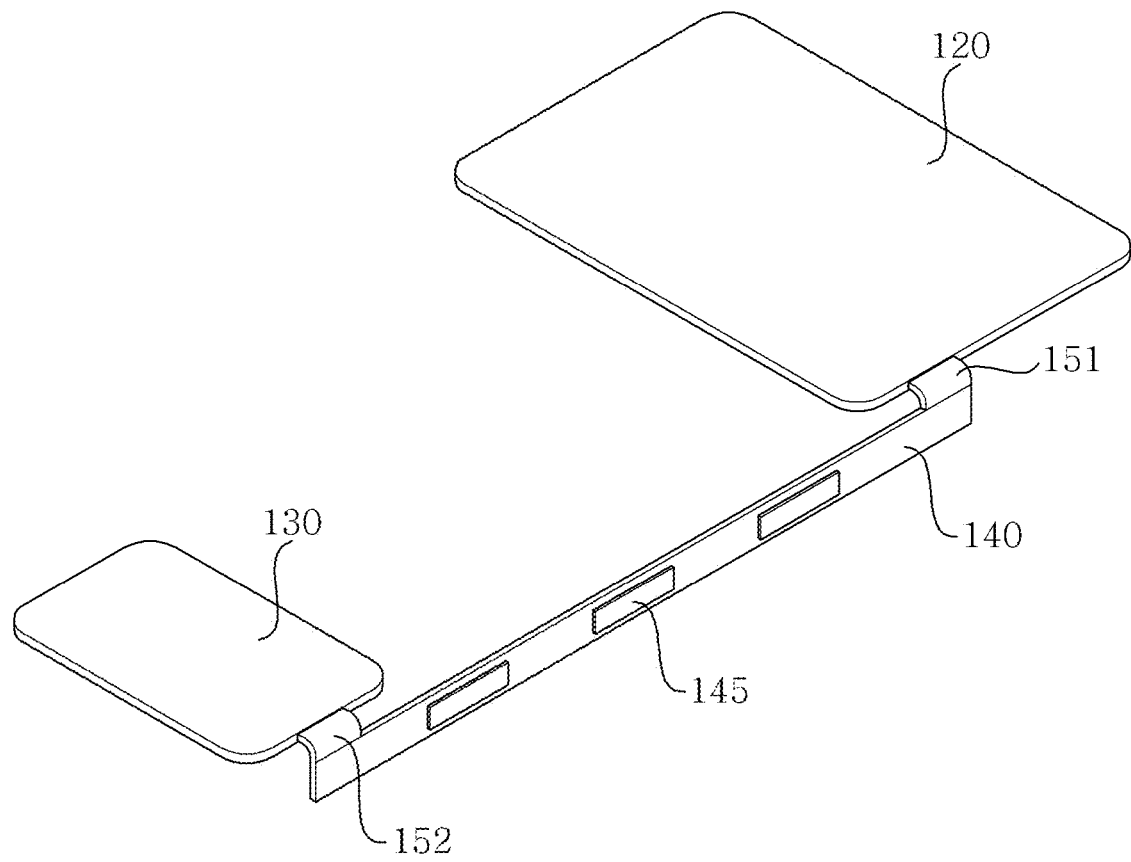
FIG. 2 is a view showing a first substrate, a second substrate, and a connection substrate of FIG. 1.

FIG. 1 is a view showing a portable terminal according to a first preferred embodiment of the present invention and FIG. 2 is a view showing a first substrate, a second substrate, and a connection substrate of FIG. 1.

Referring to FIGS. 1 and 2, the portable terminal according to the first preferred embodiment of the present invention may include a case 110, a first substrate 120, a second substrate 130, and a connection substrate 140.

The case 110 may receive the first substrate 120, the second substrate 130, the connection substrate 140, a battery 10, and the like. The case 110 may be formed in various shapes such as a rectangular shape and the like. An input part, a connection part, an input/output port and the like may be disposed in plural on one side or both sides of the case 110.

The first substrate 120 may be disposed on one side of the case 110. The above-mentioned first substrate 120 may be a rigid substrate.

The second substrate 130 may be disposed to be spaced from the first substrate 120 to thereby form a battery installing space 115. In this structure, the battery installing space 115 may be formed between the first substrate 120 and the second substrate 130. A camera module, a power supply unit, and the like may be electrically connected to the second substrate 130. The above-mentioned second substrate 130 may be the rigid substrate.

A main substrate controlling the portable terminal may be divided into the first substrate 120 and the second substrate 130. Of course, one of the first substrate 120 and the second substrate 130 may be the main substrate, and the other may be a sub-substrate. The main substrate may control the portable terminal, and the sub-substrate may be connected with parts such as the camera module, the power supplying unit, and the like.

The connection substrate 140 may electrically connect between the first substrate 120 and the second substrate 130. The connection substrate 140 may have a wiring formed thereon to be connected to wirings of the first substrate 120 and the second substrate 130. The above-mentioned connection substrate 140 may be a flexible substrate or a rigid substrate.

The connection substrate 140 may be disposed in parallel with a side of the case 110. Since the connection substrate 140 is disposed in parallel with a side of the case 110, the battery installing space 115 may be expanded as much as almost the connection substrate 140 without changing an inner structure of the portable terminal. That is, since the connection substrate is disposed at a position in which the connection substrate contacts or almost contacts the side of the case 110, the battery installing space 115 may be relatively increased.

In addition, the connection substrate 140 may be disposed perpendicularly to the first substrate 120 and the second substrate 130. In this case, the first substrate 120 and the second substrate 130 may be disposed in parallel with one surface of the case 110, and the connection substrate 140 may be disposed perpendicularly to one surface of the case 110 and in parallel with the side of the case 110. Since the connection substrate 140 is disposed in a state in which it is erected at the side of the case 110, an installing space of the connection substrate 140 in the case 110 may be significantly decreased. Therefore, the battery installing space 115 may be expanded as much as almost a width of the connection substrate 140. That is, a side space of the case 110 may be utilized as the battery installing space 115.

A connection terminal 145, a part, and the like may be mounted on the connection substrate 140. The connection terminal 145, a part, and the like may be electrically connected to the wiring of the connection substrate 140.

The portable terminal may further include a first flexible substrate 151 and a second flexible substrate 152.

The first flexible substrate 151 may electrically connect between the first substrate 120 and the one side of the connection substrate 140. The first flexible connection substrate 151 may have a wiring formed so as to connect between wirings of the first substrate 120 and the connection substrate 140.

The second flexible substrate 152 may electrically connect between the second substrate 130 and the other side of the connection substrate 140. The second flexible substrate 152 may have a wiring formed so as to connect between wirings of the second substrate 130 and the connection substrate 140.

The first flexible substrate 151 and the second flexible substrate 152 are flexibly bended, such that the connection substrate 140 may be disposed perpendicularly to the first substrate 120 and the second substrate 130. In addition, since the first flexible substrate 151 and the second flexible substrate 152 are flexibly bended, the first substrate 120, the second substrate 130, and the connection substrate 140 may be easily installed in the case 110. In addition, since the first flexible substrate 151 and the second flexible substrate 152 which are flexibly connect the first substrate 120, the second substrate 130, and the connection substrate 140 to one another, even if impact is applied to the portable terminal, damage to a connection portion between the first substrate 120, the second substrate 130, and the connection substrate 140 may be prevented.

As described above, since the connection substrate 140 is disposed at the side of the case 110, the battery installing space 115 may be expanded in a width direction of the case 110. Therefore, the battery 10 having a relatively larger size may be installed in the portable terminal. In addition, the battery installing space may be increased almost without changing the inner structure of the portable terminal.

Figure 3A:
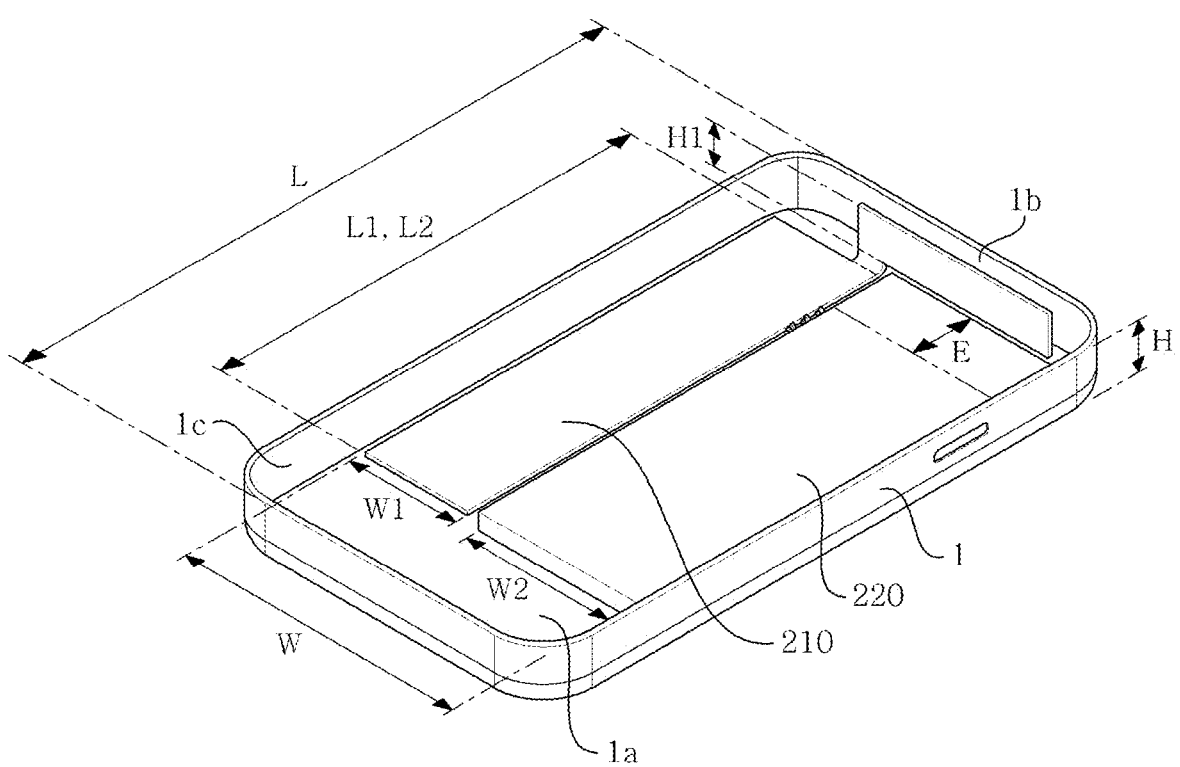
FIG. 3A is a perspective view of a portable terminal according to a second preferred embodiment of the present invention.
Figure 3B:
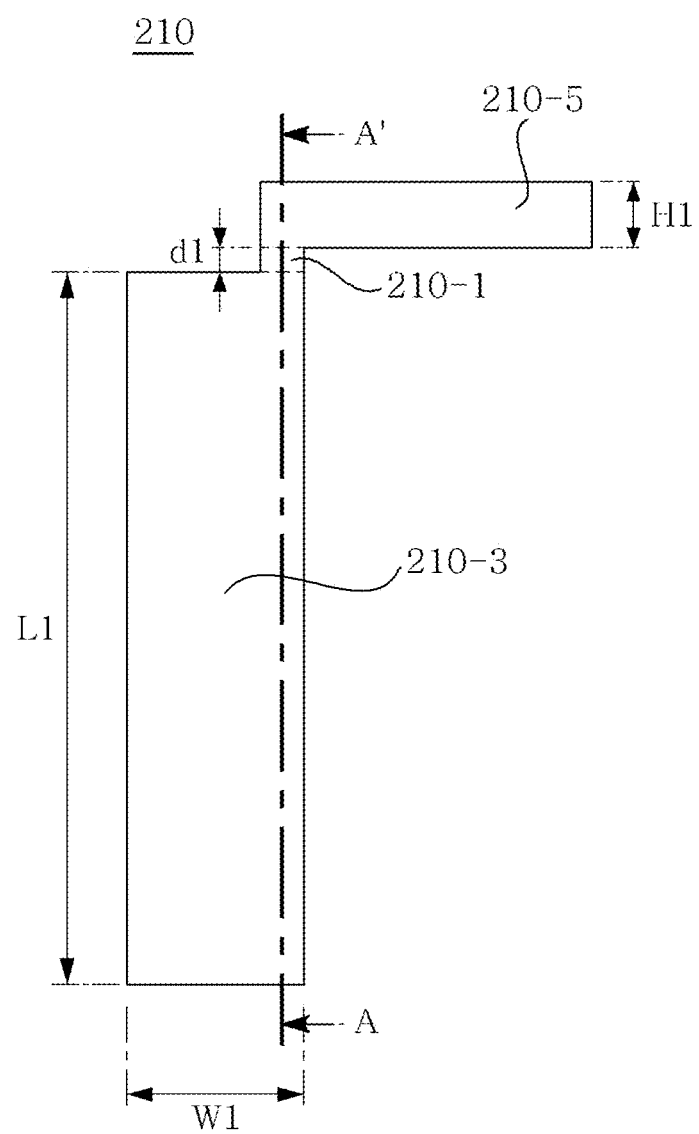
FIG. 3B is a plan view unfolding a flexible-rigid substrate of FIG. 3A.
Figure 3C:
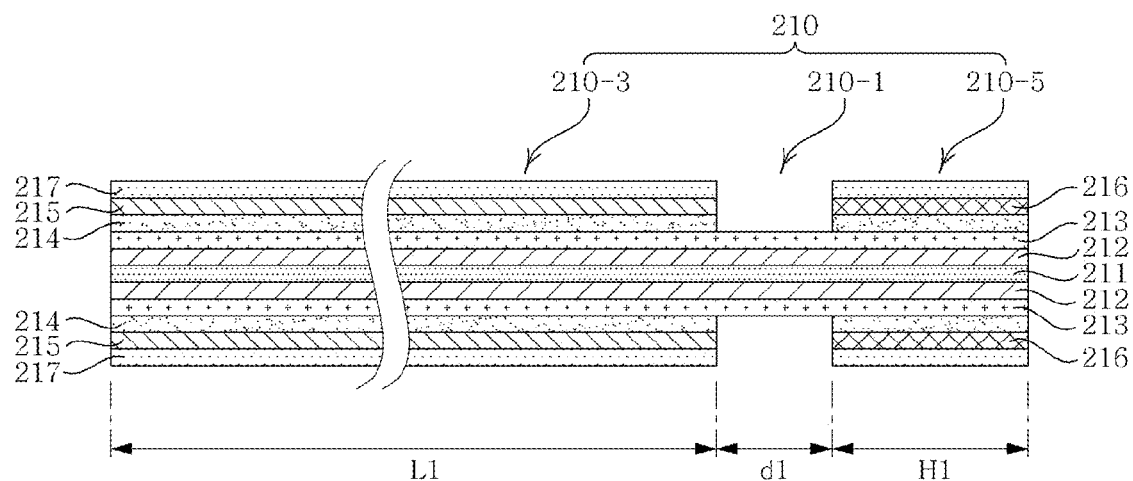
FIG. 3C is a cross-sectional view of the substrate cut along the line A-A' of FIG. 3B.

FIG. 3A is a perspective view of a portable terminal according to a second preferred embodiment of the present invention, FIG. 3B is a plan view unfolding a flexible-rigid substrate of FIG. 3A, and FIG. 3C is a cross-sectional view of the substrate cut along the line A-A' of FIG. 3B.

Referring to FIGS. 3A to 3C, the portable terminal according to the second preferred embodiment of the present invention is configured to include a case 1 having a predetermined length L, a predetermined width W, and a predetermined height H, a flexible-rigid substrate 210 disposed at a part of a horizontal plane and a vertical plane of the case 1, and a battery 220 electrically connected to the flexible-rigid substrate 210 to supply power.

The case 1 is configured of a horizontal plane 1a having the predetermined length L and the predetermined width W, and a vertical plane 1b or 1c having the predetermined height H. The flexible-rigid substrate 210 is disposed in the horizontal plane 1a and the vertical plane 1b or 1c in the case 1.

The flexible-rigid substrate 210 is configured of a first rigid substrate part 210-3 formed horizontally in the horizontal plane 1a of the case 1, a second rigid substrate part 210-5 formed almost perpendicularly to the horizontal plane 1a in the vertical plane (for example, 1b) of the case 1, and a flexible substrate part 210-1 formed integrally so as to bendably and electrically connect between the first rigid substrate part 210-3 and the second rigid substrate part 210-5.

The flexible substrate part 210-1 has a first area on the horizontal plane 1a of the case 1, has a second area on the vertical plane 1b or 1c of the case 1, and is formed so that a third area connected integrally to a part of the first area and a part of the second area is bendable. In this case, a length or a width d1 (that is, an interval between the first area and the second area) of the third area may be formed to be 3 mm to 210 mm.

The first rigid substrate part 210-3 forms a first rigid region in the first area of the flexible substrate part 210-1 so as to pattern a first circuit pattern in charge of a digital processing part or mount a first circuit element on the first rigid region.

In addition, the second rigid substrate part 210-5 forms a second rigid region in the second area of the flexible substrate part 210-1 so as to pattern a second circuit pattern in charge of a radio frequency (RF) processing part or mount a second circuit element on the second rigid region.

Specifically, the flexible substrate part 210-1 is configured of a polyimide layer 211 configured of the first, second, and third areas, first conductive layers (copper) 212 formed on both surfaces of the polyimide layer 211, and coverlay layers 213 formed on an upper surface of the first conductive layer 212 by a predetermined adhesive.

Here, the first conductive layer 212 may be provided with a circuit pattern patterned by exposure and etching, for example, a wiring pattern electrically connecting between the first and second rigid substrate parts 210-3 and 210-5.

In addition, the coverlay layer 213 protects a surface of the flexible substrate part 210-1 with insulating property thereof.

The first rigid substrate part 210-3 is configured of prepregs 214 formed on both surfaces of the first rigid region of the flexible substrate part 210-1, second conductive layers 215 formed on upper surfaces of the prepregs 214, and photosensitive solder resist (PSR) ink 217 formed on upper surfaces of the second conductive layers 215.

Here, the prepregs 214 which are for rigidly forming the first rigid substrate part 210-3 are formed on both surfaces of the first area of the flexible substrate part 210-1 (specifically, the coverlay layer 213).

In addition, similar to the first conductive layer 212, the circuit pattern patterned by exposure and etching (for example, the first circuit pattern in charge of the digital processing part) may be patterned on the second conductive layer 215 or the first circuit element may be mounted on the second conductive layer 215.

In addition, the first rigid substrate part 210-3 may be provided with a through-hole (not shown) for connecting hardware connected to the flexible substrate part 210-1 or mounted on a surface of the flexible substrate part 210-1, or the first circuit element.

The second rigid substrate part 210-5 is configured of prepregs 214 formed on both surfaces of the second rigid region of the flexible substrate part 210-1, third conductive layers 216 formed on the upper surfaces of the prepregs 214, and photosensitive solder resist (PSR) ink 217 formed on upper surfaces of the third conductive layers 216.

Here, the prepregs 214 which are for rigidly forming the second rigid substrate part 210-5, are formed on both surfaces of the second area of the flexible substrate part 210-1 (specifically, the coverlay layer 213).

In addition, similar to the second conductive layer 215, the circuit pattern patterned by exposure and etching (for example, the second circuit pattern in charge of the RF processing part) may be patterned on the third conductive layer 216 or the second circuit element may be mounted on the third conductive layer 216.

In addition, the second rigid substrate part 210-5 may be provided with a through-hole (not shown) for connecting hardware connected to the flexible substrate part 210-1 or mounted on a surface of the flexible substrate part 210-1, or the first circuit element.

Therefore, the first rigid substrate part 210-3 and the second rigid substrate part 210-5 are electrically connected to each other by the flexible substrate part 210-1.

As described above, in the flexible-rigid substrate part 210, portions corresponding to the first and second areas are rigid and only a portion corresponding to the third area is flexible, such that a portion at which the first and second rigid substrate parts 210-3 and 210-5 contact is bendable, thereby making it possible to dispose the flexible-rigid substrate part 210 on both of the horizontal plane 1a and the vertical plane 1b or 1c of the case 1.

Meanwhile, the battery 220 which is electrically connected to the flexible-rigid substrate 210 to supply power, is disposed on the same plane as the horizontal plane of the flexible-rigid substrate 210 and may have an expansion part (arrows E and E') having a size expanded by a space secured in the horizontal plane of the case 1 corresponding to the size of the second rigid substrate part 210-5 due to the second rigid substrate part 210-5 formed perpendicularly to the horizontal plane.

That is, the flexible-rigid substrate 210 having the horizontal-vertical substrate structure as described above makes the second rigid substrate 210-5 become a structure which is perpendicular but not horizontal to the first rigid substrate part 210-3, such that the area of the battery 220 may be widened by a horizontal area occupied by the second rigid substrate part 210-5. Therefore, the capacity of the battery 220 is also increased as much as the area of the battery 220 is increased.

Specifically, in the portable terminal 200 according to the second preferred embodiment of the present invention as shown in FIGS. 3A and 3B, in the case in which a part of an upper side of the first area and a part of a lower side of the second area (or although not shown, a part of a lower side of the first area and a part of an upper side of the second area) are integrally connected to the third area in the flexible-rigid substrate 210, the first rigid substrate part 210-3 may have a length L1 corresponding to the length L of the case 1 and a predetermined width W1.

In this case, a width W2 of the battery 220 is fixed by the width W of the case 1 and the first rigid substrate part 210-3, but the length L2 of the battery may have a size expanded by the space secured in the horizontal plane 1a of the case 1 corresponding to the size of the second rigid substrate part 210-5 due to the second rigid substrate part 210-5 formed perpendicularly to the horizontal plane 1a, that is, may have the expansion part (the arrow E) which is an expanded length.

For example, in the case in which the battery has a rectangular shape having a ratio of 4:3 that the length L2 thereof is longer than the width W2 thereof, as the length L2 of the battery 220 is expanded by about 0.1% to 0.5%, the capacity of the battery 220 may be increased by about 8% to 212%.

Figure 4A:
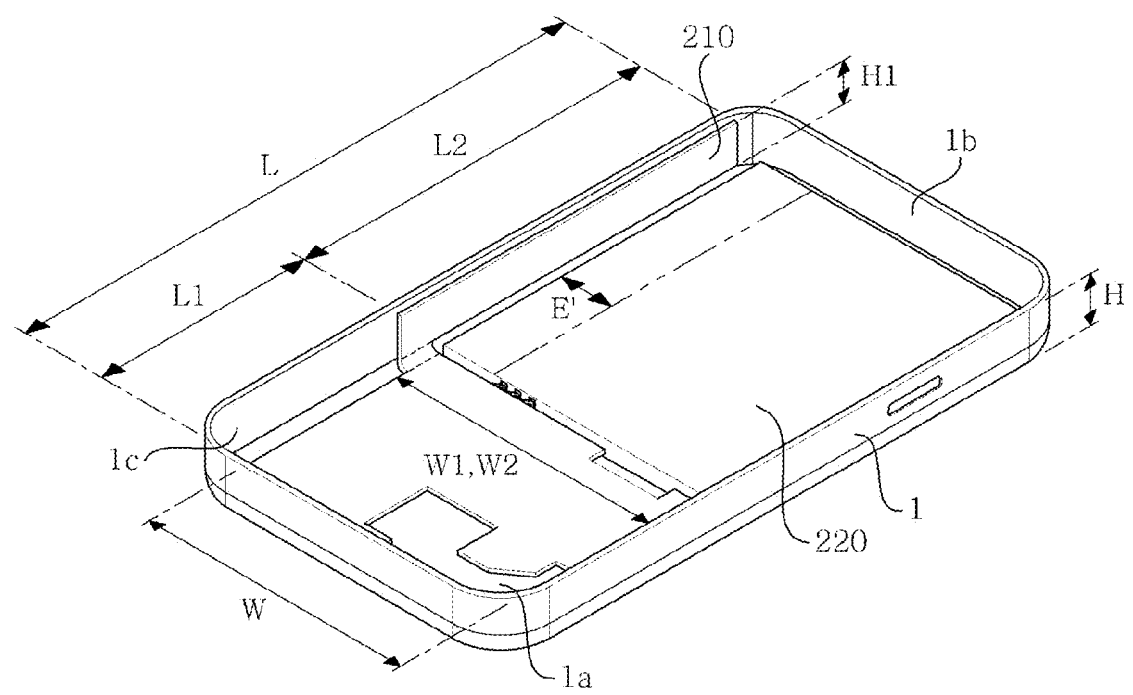
FIG. 4A is a perspective view of a portable terminal according to a third preferred embodiment of the present invention.
Figure 4B:
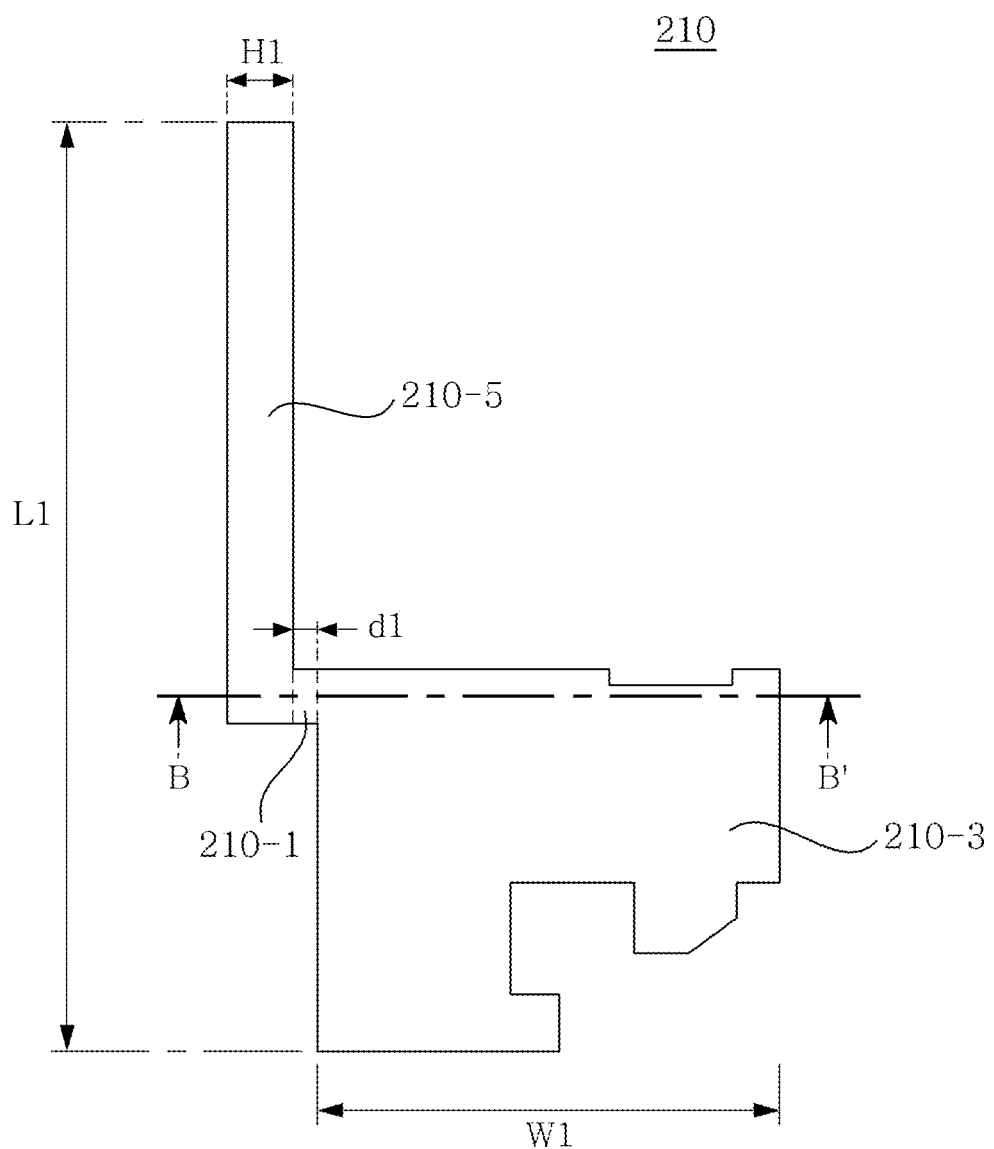
FIG. 4B is a plan view unfolding a flexible-rigid substrate of FIG. 4A.
Figure 4C:
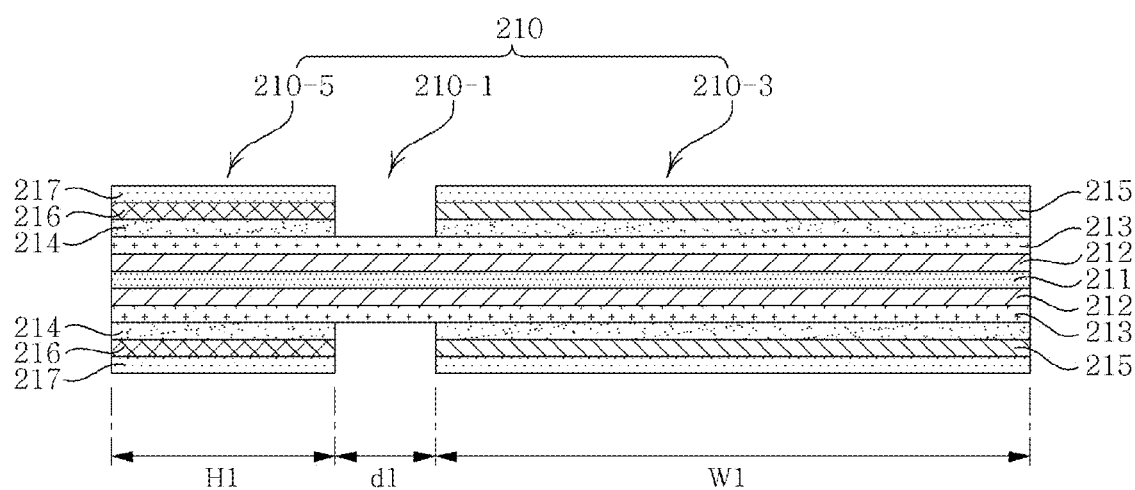
FIG. 4C is a cross-sectional view of the substrate cut along the line B-B' of FIG. 4B.

FIG. 4A is a perspective view of a portable terminal according to a third preferred embodiment of the present invention, FIG. 4B is a plan view unfolding a flexible-rigid substrate of FIG. 4A, and FIG. 4C is a cross-sectional view of the substrate cut along the line B-B' of FIG. 4B.

Here, the portable terminal according to the third preferred embodiment of the present invention as shown in FIGS. 4A to 4C is the same as the portable terminal according to the second preferred embodiment of the present invention as shown in FIGS. 3A to 3C except for the position at which the horizontal plane and the vertical plane are connected and bended in the portable terminal according to the second preferred embodiment of the present invention as shown in FIGS. 3A to 3C. Therefore, a detailed description of the same components will be omitted.

Referring to FIGS. 4A to 4C, similar to the second preferred embodiment of the present invention, in the flexible-rigid substrate 210, portions corresponding to the first and second areas are rigid and only a portion corresponding to the third area is flexible, such that a portion at which the first and second rigid substrate parts 210-3 and 210-5 contact is bendable, thereby making it possible to dispose the flexible-rigid substrate 210 on both of the horizontal plane 1a and the vertical plane 1b or 1c of the case 1.

Specifically, in the portable terminal 200 according to the third preferred embodiment of the present invention as shown in FIGS. 4A and 4B, in the case in which a part of a left side of the first area and a part of right side of the second area (or although not shown, a part of a right side of the first area and a part of a left side of the second area) are integrally connected to the third area in the flexible-rigid substrate 210, the first rigid substrate part 210-3 may have a width W1 fixed to a width corresponding to the width W of the case 1 and a predetermined length L1.

In this case, a length L2 of the battery 220 is fixed by the length L of the case 1 and the first rigid substrate part 210-3, but the width W2 of the battery 220 may have a size expanded by the space secured in the horizontal plane 1a of the case 1 corresponding to the size of the second rigid substrate part 210-5 due to the second rigid substrate part 210-5 formed perpendicularly to the horizontal plane 1a, that is, may have the expansion part (the arrow E') which is an expanded width.

For example, in the case in which the battery 220 has a rectangular shape having a ratio of 4:3 that the length L2 thereof is longer than the width W2 thereof; as the width W2 of the battery 220 is expanded by about 0.1% to 0.5%, the capacity of the battery 220 may be increased by about 210% to 215%.

When converting the capacity of the battery 220 increased by about 210% to 215% into time, in a case of a standby mode being a state in which a user does not use the portable terminal 200 and only turns on the power, the capacity of the battery 220 may be further maintained by about 30 hours, and in a case of a smart mode in which the user uses the portable terminal 200 such as an internet search, making a call, an execution of various application, and the like, the capacity of the battery 220 may be further maintained for about 2 to 3 hours.

As described above, the portable terminal according to the first to third preferred embodiments of the present invention may remove the dead space and secure the battery space by changing the substrate structure to a horizontal-vertical substrate structure, thereby maximizing space utilization.

In addition, since the substrates having the horizontal-vertical substrate structure may be integrally formed, they are electrically connected to each other by impedance matching between the horizontal and vertical substrates, thereby making it possible to prevent EMI/ESD.

According to the preferred embodiment of the present invention, the substrate structure is changed using the flexible-rigid substrate of the horizontal-vertical substrate structure, such that the dead space is removed and the battery space is secured, thereby maximizing the space utilization.

In addition, the flexible-rigid substrate of the horizontal-vertical substrate structure is integrally formed, thereby preventing EMI/ESD.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:
1. A portable terminal, comprising:
a case;
a first substrate disposed at a bottom surface of the case;
a second substrate disposed at the bottom surface of the case and spaced from the first substrate to form a battery installing space; and
a connection substrate electrically connecting the first substrate with the second substrate and disposed substantially perpendicular to the first substrate and the second substrate and facing a lateral surface of the case.

2. The portable terminal as set forth in claim 1, further comprising:
   a first flexible substrate electrically connecting between the first substrate and one side of the connection substrate; and
   a second flexible substrate electrically connecting the second substrate and the other side of the connection substrate.

3. The portable terminal as set forth in claim 1, wherein the first substrate and the second substrate are a rigid substrate.

4. The portable terminal as set forth in claim 1, wherein the connection substrate is a rigid substrate.

5. A portable terminal, comprising:
   a case including a horizontal plane having a predetermined length and width and a vertical plane having a predetermined height;
   a flexible-rigid substrate including a first rigid substrate part formed horizontally in a horizontal plane of the case, a second rigid substrate part formed substantially perpendicularly to the horizontal plane, and a flexible substrate part formed so as to bendably and electrically connect the first rigid substrate part with the second rigid substrate part; and
   a battery electrically connected to the flexible-rigid substrate to supply power, wherein the first rigid substrate part faces a lateral surface of the battery and the second rigid substrate part faces another lateral surface of the battery.

6. The portable terminal as set forth in claim 5, wherein the flexible substrate part has a first area in the horizontal plane of the case, has a second area in the vertical plane, and is formed so that a third area connected integrally to a part of the first area and a part of the second area is bendable,
   the first rigid substrate part forms a first rigid region in the first area of the flexible substrate part so as to pattern a first circuit pattern in charge of a digital processing part or mount a first circuit element on the first rigid region, and
   the second rigid substrate part forms a second rigid region in the second area of the flexible substrate so as to pattern a second circuit pattern in charge of a radio frequency (RF) processing part or mount a second circuit element on the second rigid region.

7. The portable terminal as set forth in claim 6, wherein the flexible substrate part includes:
   a polyimide layer including the first, second, and third areas;
   first conductive layers formed on both surfaces of the polyimide layer; and
   coverlay layers formed on upper surfaces of the first conductive layers.

8. The portable terminal as set forth in claim 7, wherein the first conductive layer is patterned with a wiring pattern electrically connecting the first rigid substrate part and the second rigid substrate part.

9. The portable terminal as set forth in claim 6, wherein the first rigid substrate part includes:
   prepregs formed on both surfaces of the first rigid region of the flexible substrate part;
   second conductive layers formed on upper surfaces of the prepregs; and
   photosensitive solder resist (PSR) ink formed on upper surfaces of the second conductive layers.

10. The portable terminal as set forth in claim 9, wherein the second conductive layer is patterned with the first circuit pattern by exposure and etching or is mounted with the first circuit element.

11. The portable terminal as set forth in claim 6, wherein the second rigid substrate part includes:
   prepregs formed on both surfaces of the second rigid region of the flexible substrate part;
   third conductive layers formed on upper surfaces of the prepregs; and
   photosensitive solder resist (PSR) ink formed on upper surfaces of the third conductive layers.

12. The portable terminal as set forth in claim 11 wherein the third conductive layer is patterned with the second circuit pattern by exposure and etching or is mounted with the second circuit element.

13. The portable terminal as set forth in claim 5, wherein the battery is disposed on the horizontal plane on which the first rigid substrate part is disposed, and the second rigid substrate part is disposed substantially perpendicularly to the horizontal plane so as to expand a space for installation of the battery.

* * * * *